(12) United States Patent
Hiramatsu et al.

(10) Patent No.: US 10,757,439 B2
(45) Date of Patent: Aug. 25, 2020

(54) ARITHMETIC UNIT, TRANSMISSION PROGRAM, AND TRANSMISSION METHOD

(71) Applicant: Hitachi, Ltd., Tokyo (JP)

(72) Inventors: Yoshitaka Hiramatsu, Tokyo (JP);
Nobuaki Kabuto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/827,145

(22) Filed: Nov. 30, 2017

(65) Prior Publication Data

US 2018/0160140 A1  Jun. 7, 2018

(30) Foreign Application Priority Data

Dec. 6, 2016  (JP) .................................. 2016-236399

(51) Int. Cl.
| | | |
|---|---|---|
| *H04N 19/463* | (2014.01) | |
| *H04N 19/20* | (2014.01) | |
| *A61B 5/11* | (2006.01) | |
| *H04N 19/513* | (2014.01) | |
| *H03M 13/33* | (2006.01) | |
| *H04N 19/52* | (2014.01) | |
| *H04N 19/67* | (2014.01) | |
| *H04N 19/66* | (2014.01) | |
| *H03M 13/35* | (2006.01) | |

(52) U.S. Cl.
CPC .......... *H04N 19/521* (2014.11); *H03M 13/33* (2013.01); *H03M 13/356* (2013.01); *H04N 19/52* (2014.11); *H04N 19/66* (2014.11); *H04N 19/67* (2014.11)

(58) Field of Classification Search
CPC ...... H04N 19/521; H04N 19/66; H04N 19/67; H04N 19/52; H03M 13/33
See application file for complete search history.

(56) References Cited

U.S. PATENT DOCUMENTS

| | | | | |
|---|---|---|---|---|
| 5,184,223 A | * | 2/1993 | Mihara .................. | G02B 13/08 348/207.99 |
| 5,392,223 A | * | 2/1995 | Caci ...................... | H04N 7/147 348/14.12 |

(Continued)

FOREIGN PATENT DOCUMENTS

| | | |
|---|---|---|
| JP | 11-225161 A | 8/1999 |
| JP | 2009-303176 A | 12/2009 |

(Continued)

OTHER PUBLICATIONS

Japanese Office Action received in corresponding Japanese Application No. 2016-236399 dated Feb. 25, 2020.

*Primary Examiner* — Philip P. Dang
(74) *Attorney, Agent, or Firm* — Mattingly & Malur, PC

(57) ABSTRACT

An arithmetic unit comprises a video input unit to which is input recorded video information obtained by taking a video of a human, a memory which stores human motion information as information related to movement of the human, and a transmission unit which determines importance of the human motion information, and sends the recorded video information and the human motion information to an external device so that availability of the human motion information in the external device will increase more for the human motion information determined as having high importance.

18 Claims, 17 Drawing Sheets

(56) References Cited

U.S. PATENT DOCUMENTS

| | | | | |
|---|---|---|---|---|
| 5,995,193 A * | 11/1999 | Stephany | | G03B 17/24 |
| | | | | 347/98 |
| 6,009,236 A * | 12/1999 | Mishima | | H04N 9/8042 |
| | | | | 375/E7.026 |
| 6,069,929 A * | 5/2000 | Yabe | | H04W 52/0238 |
| | | | | 375/368 |
| 6,301,447 B1 * | 10/2001 | Jackson | | G03B 17/561 |
| | | | | 348/50 |
| 7,184,100 B1 * | 2/2007 | Wilf | | G11B 27/28 |
| | | | | 348/700 |
| 7,236,684 B2 * | 6/2007 | Kawakami | | G11B 20/10 |
| | | | | 386/278 |
| 7,313,814 B2 * | 12/2007 | Zhu | | G06Q 20/382 |
| | | | | 348/E7.056 |
| 7,504,942 B2 * | 3/2009 | Marman | | G08B 13/19686 |
| | | | | 340/541 |
| 7,756,118 B2 * | 7/2010 | Harmon | | H04L 45/3065 |
| | | | | 348/585 |
| 7,813,822 B1 * | 10/2010 | Hoffberg | | G06K 9/00369 |
| | | | | 381/73.1 |
| 7,817,901 B2 * | 10/2010 | Nakajima | | H04N 5/7824 |
| | | | | 360/32 |
| 7,847,820 B2 * | 12/2010 | Vallone | | H04N 7/181 |
| | | | | 348/143 |
| 7,953,090 B2 * | 5/2011 | Wei | | H04L 12/2856 |
| | | | | 370/392 |
| 7,983,817 B2 * | 7/2011 | Breed | | B60N 2/002 |
| | | | | 250/578.1 |
| 8,054,340 B2 * | 11/2011 | Miki | | H04N 5/772 |
| | | | | 348/143 |
| 8,060,129 B2 * | 11/2011 | Grob | | H04W 52/10 |
| | | | | 455/522 |
| 8,121,078 B2 * | 2/2012 | Siann | | H04N 21/44227 |
| | | | | 370/328 |
| 8,139,098 B2 * | 3/2012 | Carter | | H04N 7/142 |
| | | | | 348/14.06 |
| 8,300,107 B2 * | 10/2012 | Strandwitz | | H04N 1/00281 |
| | | | | 348/211.99 |
| 8,316,237 B1 * | 11/2012 | Felsher | | H04L 9/0825 |
| | | | | 380/282 |
| 8,325,214 B2 * | 12/2012 | Hildreth | | H04M 3/42 |
| | | | | 348/14.03 |
| 8,725,330 B2 * | 5/2014 | Failing | | B60L 53/30 |
| | | | | 701/22 |
| 8,752,009 B2 * | 6/2014 | Nomura | | G06F 8/71 |
| | | | | 717/110 |
| 8,897,376 B2 * | 11/2014 | Kato | | G11B 20/10 |
| | | | | 375/240.26 |
| 9,014,661 B2 * | 4/2015 | deCharms | | H04W 4/021 |
| | | | | 455/404.2 |
| 9,055,199 B2 * | 6/2015 | Jung | | H04N 5/23212 |
| 9,253,285 B2 * | 2/2016 | McLane | | H03M 13/05 |
| 9,253,520 B2 * | 2/2016 | Shoemake | | H04N 5/23206 |
| 9,317,762 B2 * | 4/2016 | Kikkeri | | G06K 9/00221 |
| 9,361,011 B1 * | 6/2016 | Burns | | G06F 3/14 |
| 9,386,230 B1 * | 7/2016 | Duran | | H04N 5/2254 |
| 2003/0079222 A1 * | 4/2003 | Boykin | | H04N 21/235 |
| | | | | 725/31 |
| 2004/0085205 A1 * | 5/2004 | Yeh | | G08B 13/19634 |
| | | | | 340/540 |
| 2005/0111541 A1 * | 5/2005 | Hatabu | | H04N 19/39 |
| | | | | 375/240.01 |
| 2007/0247515 A1 * | 10/2007 | Roman | | H04N 7/15 |
| | | | | 348/14.02 |
| 2012/0038786 A1 | 2/2012 | Kelly et al. | | |
| 2013/0159021 A1 * | 6/2013 | Felsher | | G06F 21/6245 |
| | | | | 705/3 |
| 2014/0161199 A1 * | 6/2014 | Lin | | H04N 19/166 |
| | | | | 375/240.27 |
| 2014/0337473 A1 * | 11/2014 | Frusina | | H04N 21/6131 |
| | | | | 709/217 |
| 2014/0376563 A1 * | 12/2014 | Suryavanshi | | H04N 21/631 |
| | | | | 370/412 |
| 2015/0026708 A1 * | 1/2015 | Ahmed | | G06Q 30/02 |
| | | | | 725/12 |
| 2015/0052239 A1 * | 2/2015 | Lamarca | | H04L 12/1485 |
| | | | | 709/224 |
| 2015/0070516 A1 * | 3/2015 | Shoemake | | H04N 21/4223 |
| | | | | 348/207.11 |
| 2015/0154452 A1 | 6/2015 | Bentley et al. | | |
| 2015/0163521 A1 * | 6/2015 | Kosaka | | H04N 19/67 |
| | | | | 348/43 |
| 2016/0012465 A1 * | 1/2016 | Sharp | | G06Q 20/10 |
| | | | | 705/14.17 |
| 2016/0100166 A1 * | 4/2016 | Dragne | | H04N 21/44008 |
| | | | | 375/240.03 |
| 2016/0321480 A1 * | 11/2016 | Hamlin | | G16H 10/40 |

FOREIGN PATENT DOCUMENTS

| | | |
|---|---|---|
| JP | 2011-175599 A | 9/2011 |
| JP | 2013-535931 A | 9/2013 |

* cited by examiner

FIG.7

| REDUNDANCY CONDITION TABLE 500 | | |
|---|---|---|
| CHANGE AMOUNT CONDITION 501 | FREQUENCY BAND CONDITION 502 | NUMBER OF REDUNDANCIES 503 |
| OVERALL AVERAGE CHANGE AMOUNT > A | 10Mbps | 5 |
| ARM CHANGE AMOUNT > B | 10Mbps | 3 |
| LEG CHANGE AMOUNT > C | 10Mbps | 1 |
| MAXIMUM CHANGE AMOUNT > D | 10Mbps | 3 |
| OVERALL AVERAGE CHANGE AMOUNT > A | 5Mbps | 10 |
| ARM CHANGE AMOUNT > B | 5Mbps | 6 |
| ···· | ···· | ···· |

504 — OVERALL AVERAGE CHANGE AMOUNT > A
505 — ARM CHANGE AMOUNT > B
506 — LEG CHANGE AMOUNT > C
507 — MAXIMUM CHANGE AMOUNT > D
508 — OVERALL AVERAGE CHANGE AMOUNT > A
509 — ARM CHANGE AMOUNT > B

FIG.13

REDUNDANCY CONDITION TABLE 500A

| | CHANGE AMOUNT CONDITION 501 | FREQUENCY BAND CONDITION 502 | PRIORITY 503A |
|---|---|---|---|
| 504 | OVERALL AVERAGE CHANGE AMOUNT > A | 10Mbps | HIGH |
| 505 | ARM CHANGE AMOUNT > B | 10Mbps | MEDIUM |
| 506 | LEG CHANGE AMOUNT > C | 10Mbps | LOW |
| 507 | MAXIMUM CHANGE AMOUNT > D | 10Mbps | LOW |
| 508 | OVERALL AVERAGE CHANGE AMOUNT > A | 5Mbps | HIGH |
| 509 | ARM CHANGE AMOUNT > B | 5Mbps | HIGH |
| | ... | ... | ... |

FIG.16

REDUNDANCY CONDITION TABLE 500B

| STATUS CONDITION 501A | FREQUENCY BAND CONDITION 502 | NUMBER OF REDUNDANCIES 503 |
|---|---|---|
| SHAPE OF HAND: A; POSITION OF ARM: B; POSTURE OF ARM: C | 10Mbps | 5 |
| POSITION OF LEFT HAND: D; SHAPE OF LEFT HAND: E; SHAPE OF RIGHT HAND: F; POSITION OF RIGHT HAND: G | 10Mbps | 3 |
|  | 10Mbps | 1 |
| WIDTH BETWEEN BOTH FEET: H; STEPPING DIRECTION OF FOOT: I; POSTURE OF UPPER BODY: J | 10Mbps | 3 |

# ARITHMETIC UNIT, TRANSMISSION PROGRAM, AND TRANSMISSION METHOD

INCORPORATION BY REFERENCE

The disclosure of the following priority application is herein incorporated by reference: Japanese Patent Application No. 2016-236399, filed Dec. 6, 2016.

BACKGROUND OF THE INVENTION

1. Field of the Invention

The present invention relates to an arithmetic unit, a transmission program, and a transmission method.

2. Description of Related Art

In recent years, the R&D of mobile objects that send data to servers via a wireless network is being actively conducted. In comparison to communication via a wired network, communication via a wireless network tends to encounter packet loss, and measures to prevent such packet loss are required.

There is a technology known in the related art that a data processing device for processing video data sent via a wireless network, comprising: a frequency band estimation unit which estimates a transfer rate of the wireless network; a frame construction ratio derivation unit which derives a frame construction ratio as a ratio of I frames using intra-frame encoding and P frames using inter-frame predictive encoding configuring the video; a tentative redundant packet rate calculation unit which calculates a number of tentative redundant packets based on the transfer rate estimated by the frequency band estimation unit and the frame construction ratio and calculates a tentative redundant packet rate based on the transfer rate and the number of tentative redundant packets; an encoding rate calculation which calculates an encoding rate upon encoding the video data based on the transfer rate and the tentative redundant packet rate; a video data processing unit which encodes the video data at the encoding rate and packetizes the encoded video data; and a redundant encoding processing unit which calculates a number of redundant packets to be added to the respective frames which were obtained as a result of the processing performed by the video data processing unit and adds, to the respective frames, the redundant packets obtained as a result of performing redundant encoding processing to the data packet of the encoded video data (see Japanese Laid Open Patent Publication No. 2013-535931).

SUMMARY OF THE INVENTION

With the invention disclosed in Japanese Laid Open Patent Publication No. 2013-535931, there are cases where the data sent together with the video is not received by the destination.

The arithmetic unit according to the first aspect of the present invention is an arithmetic unit comprising a video input unit to which is input recorded video information obtained by taking a video of a human, a memory which stores human motion information as information related to movement of the human, and a transmission unit which determines importance of the human motion information, and sends the recorded video information and the human motion information to an external device so that availability of the human motion information in the external device will increase more for the human motion information determined as having high importance.

The program according to the second aspect of the present invention is a transmission program to be executed in an arithmetic unit comprising a memory which stores human motion information as information related to movement of a human, wherein the transmission program causes the arithmetic unit to receive input of recorded video information obtained by taking a video of a human, and determine importance of the human motion information, and send the recorded video information and the human motion information to an external device so that availability of the human motion information in the external device will increase more for the human motion information determined as having high importance.

The transmission method according to the third aspect of the present invention is a transmission method to be executed by an arithmetic unit comprising a memory which stores human motion information as information related to movement of a human, wherein the transmission method comprises the steps of receiving input of recorded video information obtained by taking a video of a human, and determining importance of the human motion information, and sending the recorded video information and the human motion information to an external device so that availability of the human motion information in the external device will increase more for the human motion information determined as having high importance.

BRIEF DESCRIPTION OF THE DRAWINGS

FIG. 7 is a diagram showing an example of the redundancy condition table.

FIG. 13 is a diagram showing an example of the redundancy condition table in Modified Example 1.

FIG. 16 is a diagram showing an example of the redundancy condition table in Modified Example 3.

DETAILED DESCRIPTION

First Embodiment

The first embodiment of the Arithmetic system according to the present invention is now explained with reference to FIG. 1 to FIG. 12.

Figure 1:
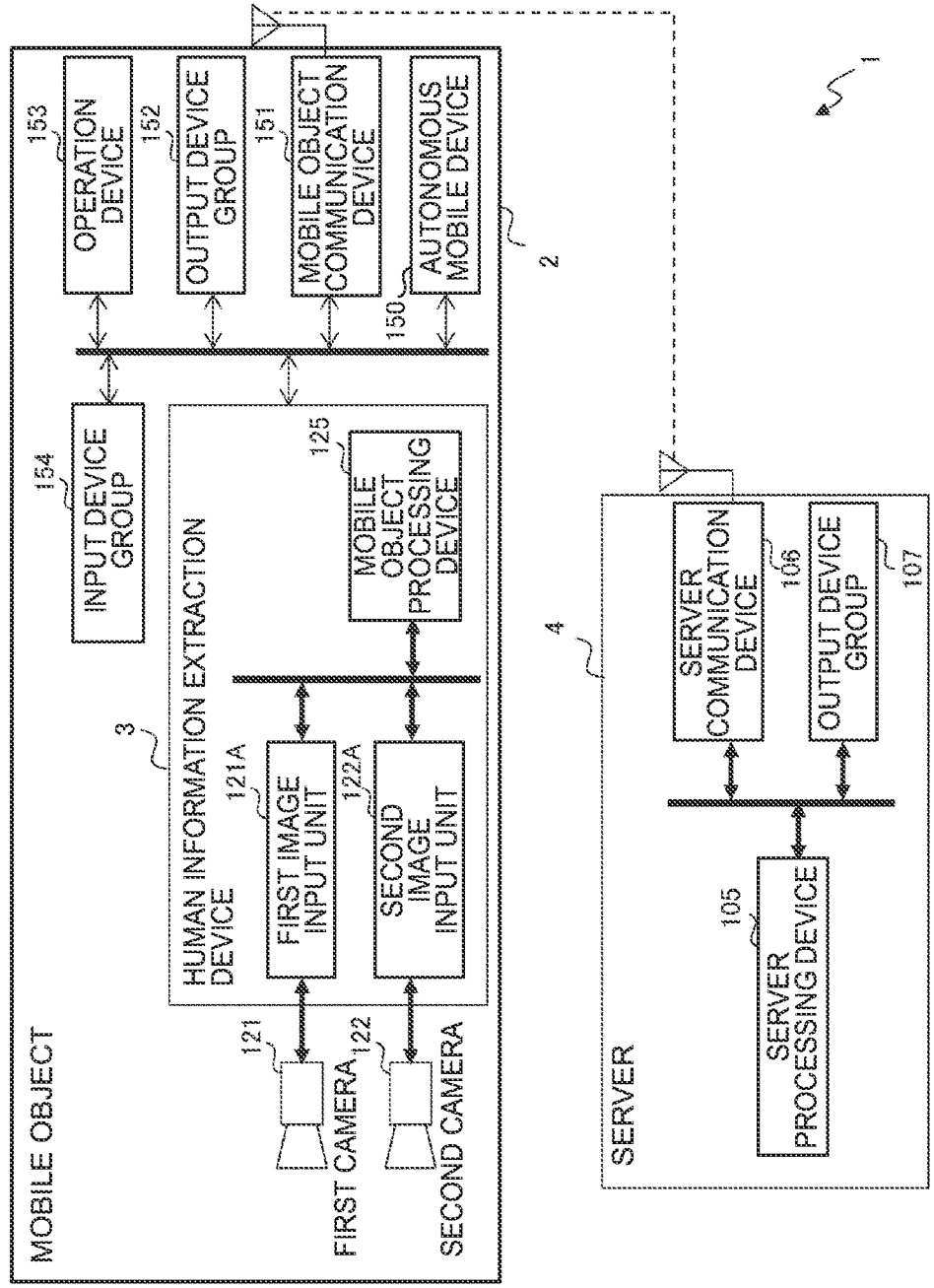
FIG. 1 is a block diagram showing a configuration of the Arithmetic system in the first embodiment.

FIG. 1 is a block diagram showing a configuration of an Arithmetic system 1. The Arithmetic system 1 comprises a mobile object 2, and a server 4. This system adopts a so-called remote brain system and is mobile, and, for instance, the mobile object which communicates with visitors and the server 4 which performs sophisticated arithmetic processing share functions. In the ensuing explanation, the target of communication of the mobile object 2 is referred to as a "user".

The mobile object 2 comprises a first camera 121 and a second camera 122 for taking a video of the periphery of the mobile object 2, a human information extraction device 3, an autonomous mobile device 150 which causes the mobile object 2 to move autonomously, a mobile object communication device 151 which performs communication, an output device group 152, an operation device 153, and an input device group 154.

The first camera 121 is a so-called color camera in which image sensors capable of observing visible region wavelengths are arranged two-dimensionally. The second camera 122 is a so-called depth camera capable of acquiring distance information based on a Time of Flight system. However, the first camera 121 may also be a so-called black-and-white camera that is unable to acquire color information, and the second camera 122 may also acquire distance information based on a different system.

The first camera 121 and the second camera 122 take a video of the periphery of the mobile object 2 and output the recorded video to a first image input unit 121A and a second image input unit 122A respectively described later. The first camera 121 and the second camera 122 acquire the recorded video of the periphery of the mobile object 2 by continuously taking images at a predetermined cycle; for instance, at a cycle of 16.7 ms. As described later, the video input to the first image input unit 121A is used for the extraction of human information and for the display on an output device group 107 in the server 4. The video input from the second image input unit 122A is used for the extraction of human information.

The human information extraction device 3 comprises a first image input unit 121A which imports the video taken by the first camera 121, a second image input unit 122A which imports the video taken by the second camera 122, and a mobile object processing device 125 which processes the videos imported from the first image input unit 121A and the second image input unit 122A. The first image input unit 121A, the second image input unit 122A, and the mobile object processing device 125 are mutually connected via an internal bus and send and receive information to and from each other. The mobile object processing device 125 processes the videos taken by the first camera 121 and the second camera 122. The configuration of the mobile object processing device 125 will be described later.

The autonomous mobile device 150 is a device for causing the mobile object 2 to move autonomously. The autonomous mobile device 150 uses, for example, sensors (not shown) for measuring the outside world and calculates the relative position and the absolute position of the mobile object 2 in the real environment, controls the moving mechanism configured from a motor and wheels, and moves to the target position based on the measured position.

The mobile object communication device 151 communicates with the server 4 via wireless communication. The mobile object communication device 151 sends, to the server 4, information input to the input device group 154, the recorded video of the first camera 121, and the human motion information described later. When the mobile object communication device 151 receives an operation command from the server 4, the mobile object communication device 151 conveys the received operation command to the output device group 152 and the operation device 153. The mobile object communication device 151 has a function of adjusting the link speed to match the strength of the received wireless signal, and reduces the link speed as the signal strength is weaker. The mobile object communication device 151 conveys the link speed to the human information extraction device 3.

The output device group 152 is one or more devices which output at least one of either video or sound. The output device group 152 is configured, for example, from a speaker which outputs sound, and a display device which presents information on a screen. The operation device 153 is a device for operating the mobile object 2 to communicate with the user. The operation device 153 operates, for example, an arm (not shown) of the mobile object 2 to communicate with the user.

The input device group 154 is a device which receives inputs from the user. The input device group 154 is configured, for example, from a microphone which receives sounds, a touch sensor which senses that it has been touched by the user, a keyboard which receives text input, and a network transmission/reception device which receives information via a network.

The server 4 comprises a server communication device 106 which communicates with the mobile object 2, a server processing device 105 which generates commands for controlling the mobile object 2 based on the information received by the server communication device 106, and an output device group 107. The server processing device 105, the server communication device 106, and the output device group 107 are connected via an internal bus and send and receive information to and from each other.

The server processing device 105 determines the immediate environment based on the information received by the server communication device 106 and decides the next action to be taken by the mobile object 2. For example, the server processing device 105 determines the user's movement based on the recorded video of the first camera 121 and the input sound information. Subsequently, the server processing device 105 generates a command for operating the mobile object 2 according to the user's movement that was determined, and outputs the generated command to the mobile object 2. The configuration of the server processing device 105 will be described later.

The server communication device 106 communicates with the mobile object 2 via wireless communication. The server communication device 106 receives the information generated by the mobile object processing device 125 from the mobile object 2, and outputs the information generated by the server processing device 105 to the mobile object 2.

(Configuration of Mobile Object Processing Device)

Figure 2:
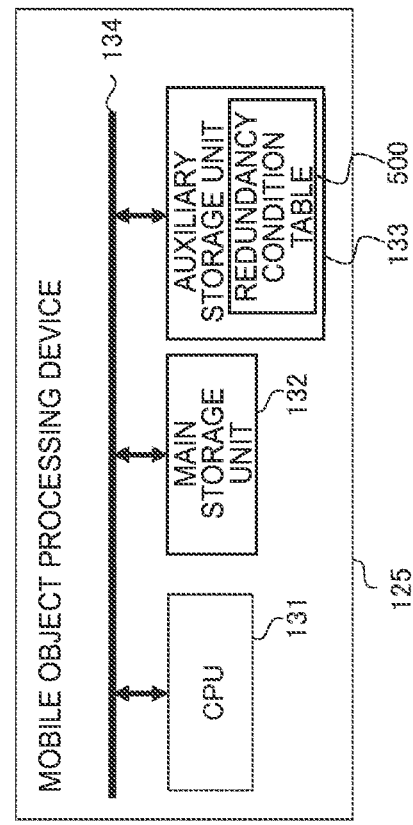
FIG. 2 is a block diagram showing a configuration of the mobile object processing device.

FIG. 2 is a block diagram showing a configuration of the mobile object processing device 125.

The mobile object processing device 125 comprises a CPU 131, a main storage unit 132, an auxiliary storage unit 133, and a bus 134. The CPU 131, the main storage unit 132, and the auxiliary storage unit 133 are connected via the bus 134 so as to mutually send and receive data.

The CPU 131 reads the programs stored in the auxiliary storage unit 133 into the main storage unit 132, and thereby executes the programs. The CPU 131 performs arithmetic operations based on the read programs, and outputs the arithmetic results to the main storage unit 132 and the auxiliary storage unit 133.

The main storage unit 132 is a random access memory. The main storage unit 132 stores the programs to be executed by the CPU 131, and the arithmetic results from the arithmetic operations performed by the CPU 131. The main storage unit 132 stores the videos acquired by the first image input unit 121A and the second image input unit 122A for a given period of time that the videos were taken.

The auxiliary storage unit 133 stores a redundancy condition table 500 described later, the programs to be executed by the CPU 131, the arithmetic results from the arithmetic operations performed by the CPU 131, and setting information used in the mobile object processing device 125. The auxiliary storage unit 133 is specifically used for storing data that cannot be stored in the main storage unit 132 and retaining data even in a state where the power is shut off. The auxiliary storage unit 133 is configured, for example, from multiple magnetic disk drives such as hard disk devices or non-volatile memories such as flash memories independently or in combination.

(Configuration of Server Processing Device)

Figure 3:
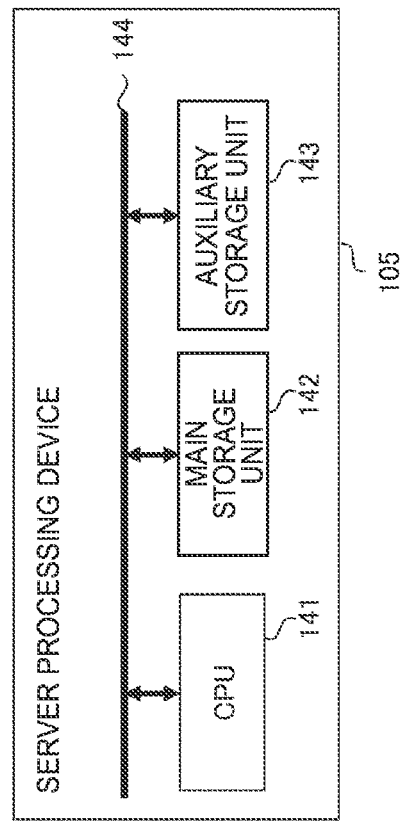
FIG. 3 is a block diagram showing a configuration of the server processing device.

FIG. 3 is a block diagram showing a configuration of the server processing device 105.

The server processing device 105 comprises a CPU 141, a main storage unit 142, an auxiliary storage unit 143, and a bus 144. The CPU 141, the main storage unit 142, and the auxiliary storage unit 143 are connected via the bus 144 so as to mutually send and receive data.

Because the configuration of the server processing device 105 is the same as the mobile object processing device 125, the detailed explanation thereof is omitted. The CPU 141 corresponds to the CPU 131, the main storage unit 142 corresponds to the main storage unit 132, and the auxiliary storage unit 143 corresponds to the auxiliary storage unit 133.

(Functional Block of Mobile Object Processing Device)

Figure 4:
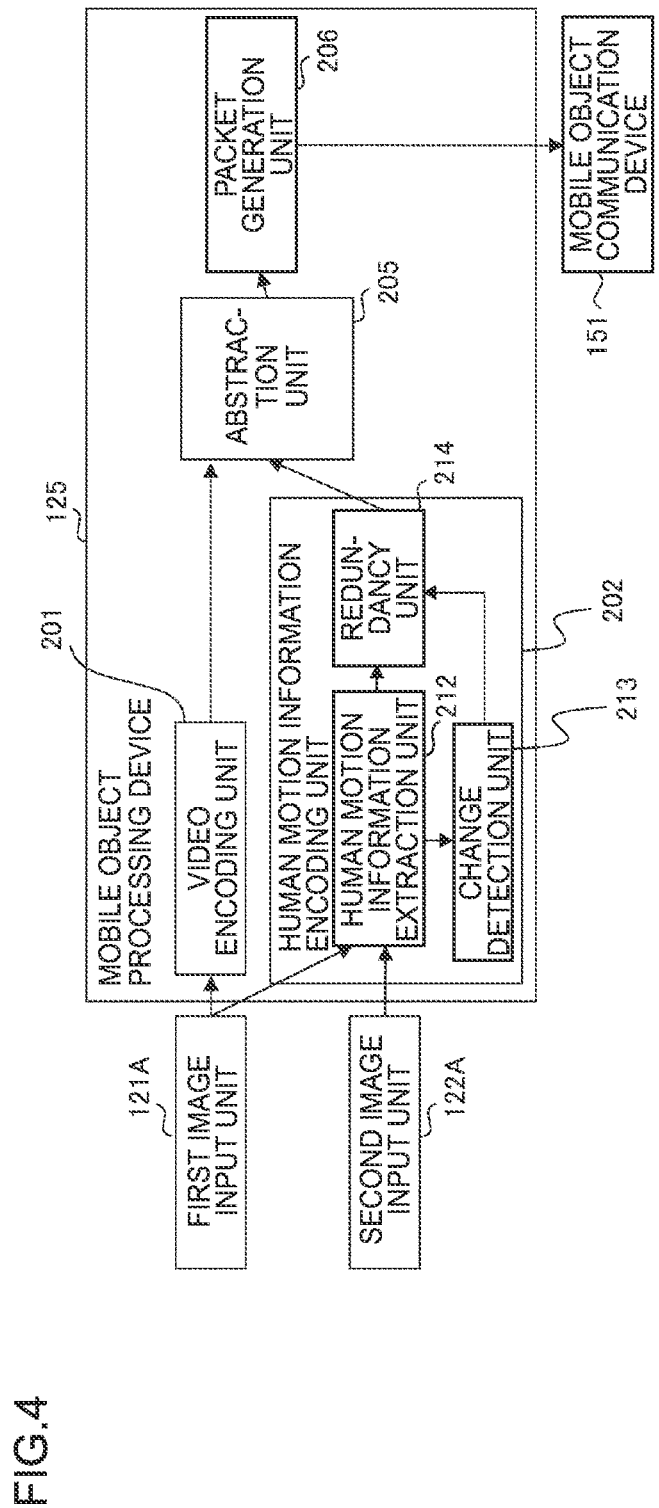
FIG. 4 is a block diagram showing a functional configuration of the mobile object processing device.

FIG. 4 is a block diagram showing a functional configuration that is realized by the CPU 131 of the mobile object processing device 125 executing the processing programs stored in the main storage unit 132. The mobile object processing device 125 comprises a video encoding unit 201, a human motion information encoding unit 202, an abstraction unit 205, and a packet generation unit 206.

The video encoding unit 201 encodes the video input from the first image input unit 121A. The encoding of the video is performed, for example, based on a standardized video encoding system such as H.264/AVC.

The human motion information encoding unit 202 comprises a human motion information extraction unit 212, a change detection unit 213, and a redundancy unit 214.

The human motion information extraction unit 212 extracts, from the video input from the first image input unit 121A and the video input from the second image input unit 122A, information related to the face of a human (user) existing around the mobile object 2 who was captured by the first camera 121 and the second camera 122 such as the area of the face, the position of facial parts, and the status of facial parts, as well as information related to the joints of that human (user) such as the position and orientation of the joints of the human. The term "status of facial parts" is, for example, the open/close status of the eyes and the open/close status of the mouth. In this embodiment, information related to the face is hereinafter referred to as "face information", information related to the joints of a human is hereinafter referred to as "joint information", and face information and joint information are hereinafter collectively referred to as "human motion information".

The change detection unit 213 detects temporal changes in the position of the face and body by using latest face information and joint information extracted from the human motion information extraction unit 212, and past face information and joint information.

The redundancy unit 214 determines the number of redundancies based on the changes detected by the change detection unit 213 and the redundancy condition table 500. The redundancy unit 214 replicates the human motion information extracted by the human motion information extraction unit 212 only in the determined number of redundancies, encodes the replicated human motion information, and outputs the encoded human motion information to the abstraction unit 205. This is based on the concept of causing more important human motion information to more reliably reach the server 4, and the number of redundancies represents the importance of the human motion information. In other words, it could be said that the redundancy unit 214 determines the importance of the human motion information by referring to the redundancy condition table 500. In the ensuing explanation, the human motion information that was encoded is hereinafter referred to as the "human motion encoded data". When the number of redundancies is the minimum number (zero), the redundancy unit 214 only outputs one human motion encoded data.

The abstraction unit 205 generates a NAL (Network Abstraction Layer) unit used in the video encoding system that has been standardized from H.264/AVC onward respectively in the video encoded data which was encoded by the video encoding unit 201, and in the human motion encoded data which was encoded by the human motion information encoding unit 202 and made redundant by the redundancy unit 214. The NAL unit is generated with the human motion encoded data as SEI (Supplemental Enhancement Information). Here, arbitrary user data is used as the SEI format to be used. The abstraction unit 205 generates stream data upon synchronizing and integrating the NAL unit included in the video encoded data and the NAL unit included in the human motion encoded data, and outputs the generated stream data to the packet generation unit 206.

The abstraction unit 205, for example, synchronizes and integrates certain video encoded data and human motion encoded data obtained by encoding the human motion information generated based on the video before the video encoded data was encoded by storing such video encoded data and human motion encoded data in the same NAL unit. As a result of performing the synchronization in the foregoing manner, the processing load can be reduced because there is no need to individually affix a time stamp. Examples of the generated NAL unit will be described later.

The packet generation unit 206 generates packets by dividing the stream data generated by the abstraction unit 205 according to a standardized system such as RTP (Real-time Transport Protocol). Examples of the generated packets will be described later.

(Functional Block of Server Processing Device)

Figure 5:
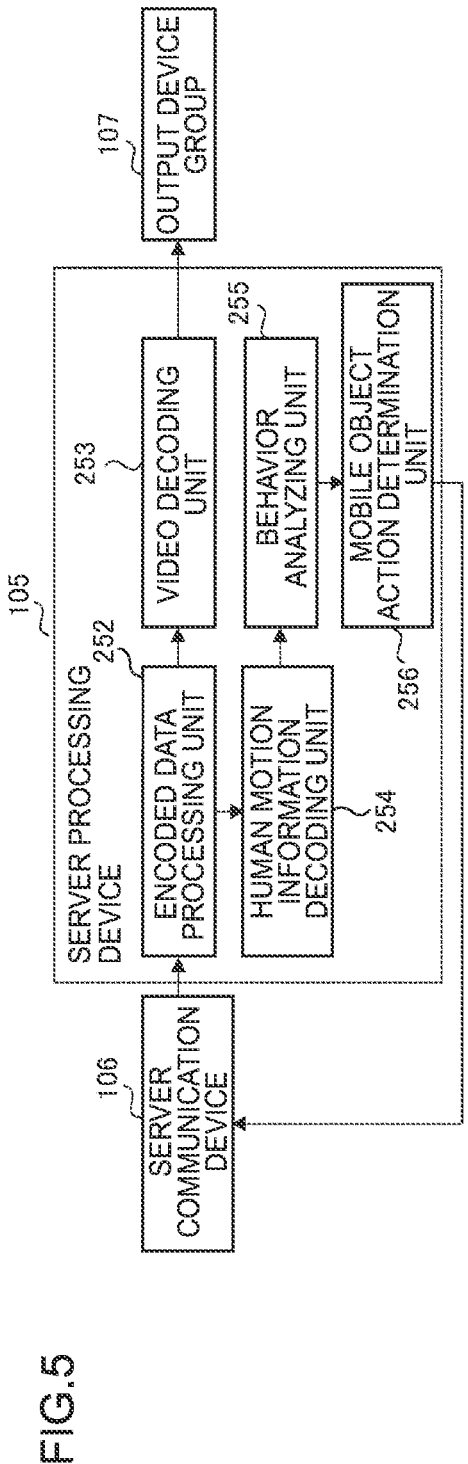
FIG. 5 is a block diagram showing a functional configuration of the server processing device.

FIG. 5 is a block diagram showing a functional configuration that is realized by the CPU 141 of the server processing device 105 executing the processing programs stored in the main storage unit 142. The server processing device 105 comprises an encoded data processing unit 252, a video decoding unit 253, a human motion information decoding unit 254, a behavior analyzing unit 255, and a mobile object action determination unit 256.

The encoded data processing unit 252 separates the SEI information and the video encoded data from the stream data input from the server communication device 106. Subsequently, the encoded data processing unit 252 outputs the SEI information to the human motion information decoding unit 254, and outputs the video encoded data to the video decoding unit 253.

The video decoding unit 253 decodes the video encoded data input from the encoded data processing unit 252 and extracts the video, and outputs the extracted video to the output device group 107.

The human motion information decoding unit 254 extracts the human motion encoded data of each from the SEI information input from the encoded data processing unit 252 and decodes the extracted human motion encoded data, and outputs the decoded human motion information to the behavior analyzing unit 255. When the human motion information decoding unit 254 detects any damage or loss of the human motion information of each frame, the human motion information decoding unit 254 restores the human motion information by using redundant data such as first redundant data and second redundant data.

The behavior analyzing unit 255 recognizes the behavior of the human from the human motion information input from the human motion information decoding unit 254. The mobile object action determination unit 256 determines the action of the mobile object 2 from the human behavior information input from the behavior analyzing unit 255, generates control information for executing the determined action, and outputs the generated control information to the server communication device 106.

(Human Motion Information)

Figure 6A:
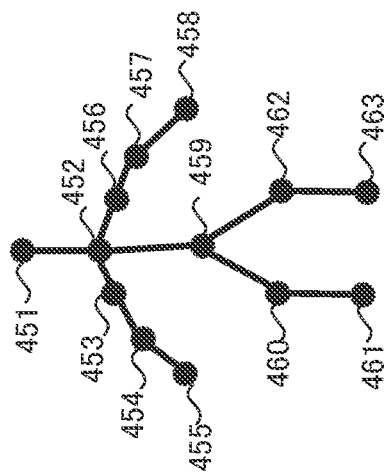
FIG. 6A is a diagram explaining the face information.
Figure 6B:
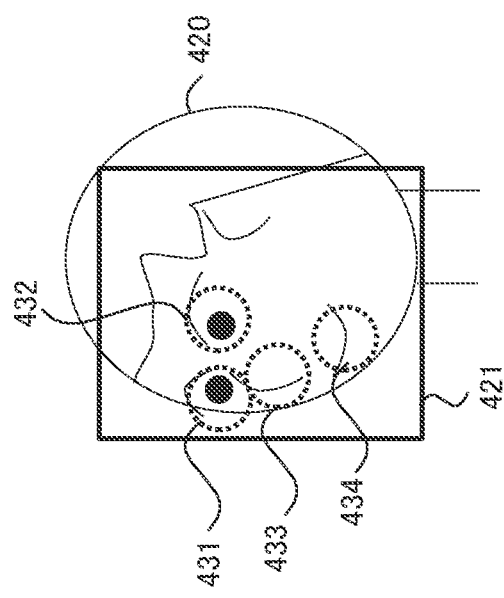
FIG. 6B is a diagram explaining the joint information.

FIG. 6 is a diagram explaining human motion information. FIG. 6A is a diagram explaining face information, and FIG. 6B is a diagram explaining joint information.

Face information includes, for example, as shown in FIG. 6A, the three-dimensional positions of the respective parts of the face 420 including a right eye 431, a left eye 432, a nose 433, and a mouth 434, a rectangular area 421 of the face, open/close status of the left eye and the right eye, open/close status of the mouth, and expression of the face 420. Furthermore, joint information includes, for example, as shown in FIG. 6B, the three-dimensional positions of the respective parts such as a head 451, a neck 452, a right shoulder 453, a right elbow 454, a right hand 455, a left shoulder 456, a left elbow 457, a left hand 458, a waist 459, a right knee 460, a right foot 461, a left knee 462, and a left foot 463, and posture information. The term "posture information" represents the orientation of the joints, and may be expressed with the three variables of yaw, roll and pitch, or with quaternion.

(Redundancy Condition Table)

FIG. 7 is a diagram showing an example of the redundancy condition table 500. The redundancy condition table 500 is configured from the fields of a change amount condition 501, a frequency band condition 502, and a number of redundancies 503. The field of the change amount condition 501 stores the condition related to the movement of the human. The field of the frequency band condition 502 stores the condition of the frequency band of communication, or link speed, between the mobile object communication device 151 and the server communication device 106. The field of the number of redundancies 503 stores the number of redundancies. The respective records configuring the redundancy condition table 500 specify, as the number of redundancies 503, the number of redundancies when the conditions indicated in both fields of the change amount condition 501 and the frequency band condition 502 are satisfied.

For example, the record 504 shows that the number of redundancies is 5 when the average change amount of each joint exceeds a predetermined threshold A and the frequency band condition is 10 Mbps. Because it would be desirable to reliably deliver the human motion information to the server 4 when the change amount is great, the redundancy condition is set so that the number of redundancies is increased as the change amount is greater. Furthermore, because it can be considered that the communication environment has aggravated as the link speed is slower, the redundancy condition is set so that the number of redundancies is increased as the link speed is slower. It is thereby possible to send the human motion information from the mobile object 2 to the server 4 at the communication durability according to the importance of the human motion information or the communication environment between the mobile object 2 and the server 4. Note that, in situations where the change amount of a specific point is important, the redundancy condition may also be dynamically changed so that the number of redundancies is increased as the change amount of such point is greater.

(NAL unit)

Figure 8A:
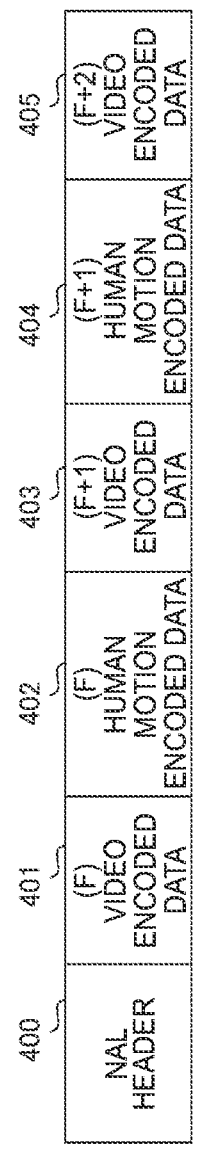
FIG. 8A is a schematic diagram of the NAL unit when the number of redundancies is zero.
Figure 8B:
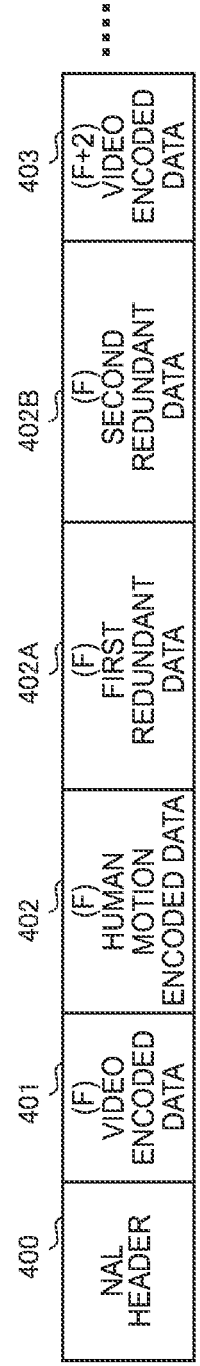
FIG. 8B is a schematic diagram of the NAL unit when the number of redundancies is "2".

FIG. 8 is a schematic diagram of the NAL unit generated by the abstraction unit 205. FIG. 8 only shows the video encoded data and the human motion encoded data, and the illustration of other elements is omitted. FIG. 8A is a diagram showing the NAL unit generated by the abstraction unit 205 when the redundancy processing is not performed; that is, when the number of redundancies is zero, and FIG. 8B is a diagram showing the NAL unit generated by the abstraction unit 205 when the number of redundancies is "2". However, FIG. 8A and FIG. 8B show examples of a configuration as the NAL containing video information and human motion information of a plurality of frames. The parentheses in the diagrams indicate the frame number, and FIG. 8A shows information from the F frame to halfway through the F+2 frame.

FIG. 8A shows a video encoded data 401 of the F frame, a human motion encoded data 402 of the F frame, a video encoded data 403 of the F+1 frame, a human motion encoded data 404 of the F+1 frame, and a video encoded data 405 of the F+2 frame. As described above, the human motion information is generated for each frame of the video information, and the video information of a certain frame and the human motion information created by using the video information of that frame are stored continuously; that is, in synchronization.

FIG. 8B shows a video encoded data 401 of the F frame, a human motion encoded data 402 of the F frame, a first redundant data 402A of the F frame, a second redundant data 402B of the F frame, and a video encoded data 403 of the F+1 frame. The first redundant data 402A of the F frame and the second redundant data 402B of the F frame are data obtained by making redundant the human motion encoded data 402 of the F frame, and these three data are the same. Accordingly because the video encoded data and the human motion encoded data of a certain frame and the redundant data are synchronized and integrated, it is possible to indicate that they are correlated without having to affix a time stamp on each of the three data.

(Packet)

Figure 9:
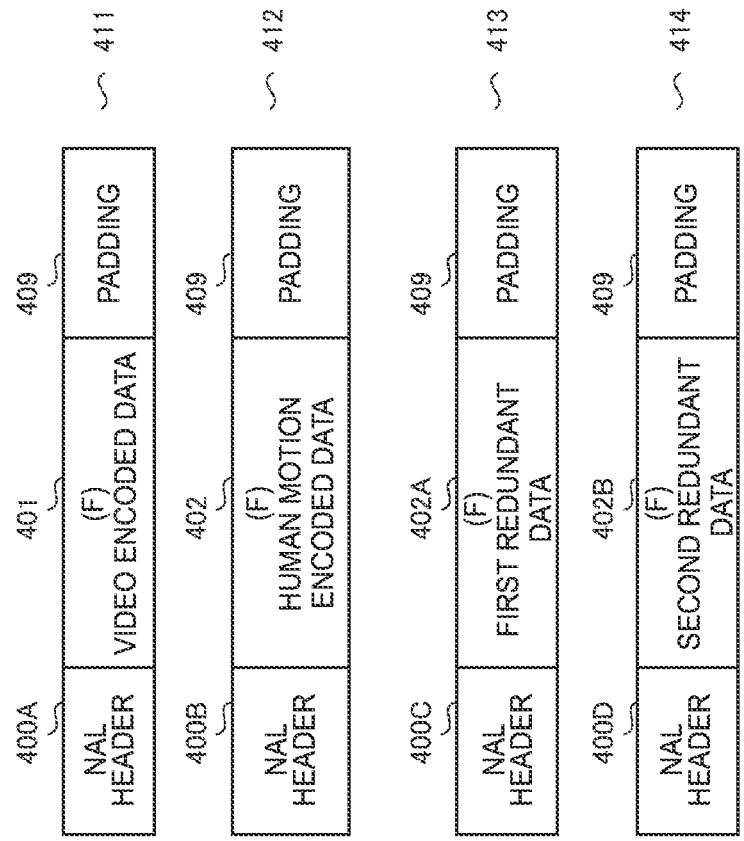
FIG. 9 is a diagram showing an overview of packets generated by the packet generation unit when the number of redundancies is "2".

FIG. 9 is a diagram showing an overview of the packets generated by the packet generation unit 206 when the number of redundancies is "2". In other words, FIG. 9 is a diagram showing a payload of the packets generated based on the NAL unit shown in FIG. 8B. However, FIG. 9 shows an example of where single video encoded data or human motion encoded data is configured as an individual NAL unit.

A payload 411 includes the video encoded data 401 of the F frame, a payload 412 includes the human motion encoded data 402 of the F frame, a payload 413 includes the first redundant data 402A of the F frame, and a payload 414 includes the second redundant data 402B of the F frame. Furthermore, a padding 409 is assigned to these payloads so that the NAL unit is appropriately divided. Because the same information exists in different packet, so as long as any one of the packets containing the payload 412, 413 or 414 reaches the server 4, the server 4 is able to obtain the human motion information corresponding to the recorded video of the F frame. In other words, by making redundant the human motion information, the availability of the human motion information in the server 4 can be improved.

(Flowchart of Mobile Object Processing Device 125)

Figure 10:
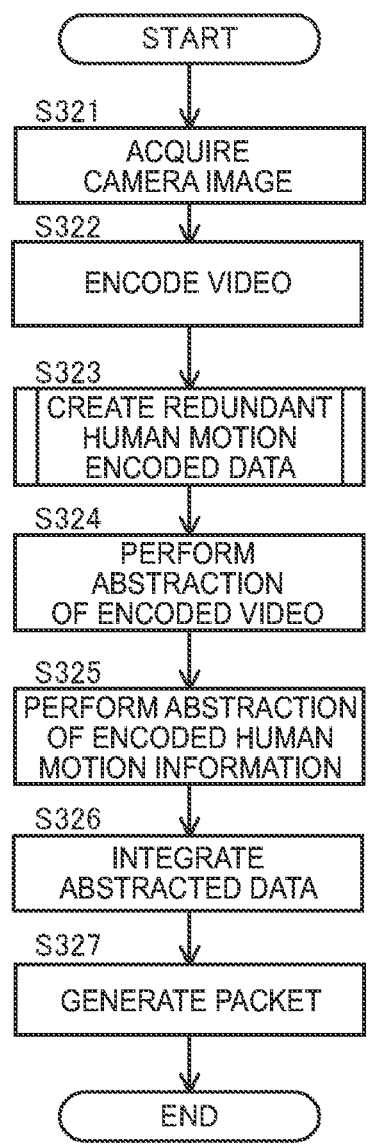
FIG. 10 is a flowchart representing the operation of the mobile object processing device.

FIG. 10 is a flowchart representing the operation of the program executed by the mobile object processing device 125. The executing subject of the flowchart explained below is the CPU 131 of the mobile object processing device 125.

In step S321, the mobile object processing device 125 acquires the recorded video of the first camera 121 and the recorded video of the second camera 122 from the first image input unit 121A and the second image input unit 122A, respectively, and then proceeds to step S322. In step S322, the video encoding unit 201 of the mobile object processing device 125 encodes the recorded video of the first camera 121 and generates video encoded data, and then proceeds to step S323. In step S323, the mobile object processing device 125 inputs the recorded video of the first camera 121 and the recorded video of the second camera 122 to the human motion information encoding unit 202, and generates redundant human motion encoded data. Details of this step will be described later with reference to FIG. 11.

In subsequent step S324, the mobile object processing device 125 performs the abstraction of the video encoded data obtained in step S322; that is, generates the NAL unit. In subsequent step S325, the mobile object processing device 125 performs the abstraction of the human motion encoded data obtained in step S323; that is, generates the NAL unit. In subsequent step S326, the mobile object processing device 125 generates stream data upon synchronizing and integrating the NAL unit generated from the video encoded data and the NAL unit generated from the human motion encoded data. In subsequent step S327, the mobile object processing device 125 generates packets from the stream data generated based on integration. The packets may be generated according to a standardized transfer protocol such as RTP. The program represented with the operation based on the flowchart shown in FIG. 10 is thereby ended.

(Flowchart of Human Motion Information Encoding Unit)

The processing of the human motion information encoding unit 202; that is, the processing of extracting various types of information of a human and generated redundant human motion encoded data as the processing of step S323 in FIG. 10, is now explained with reference to FIG. 11.

Figure 11:
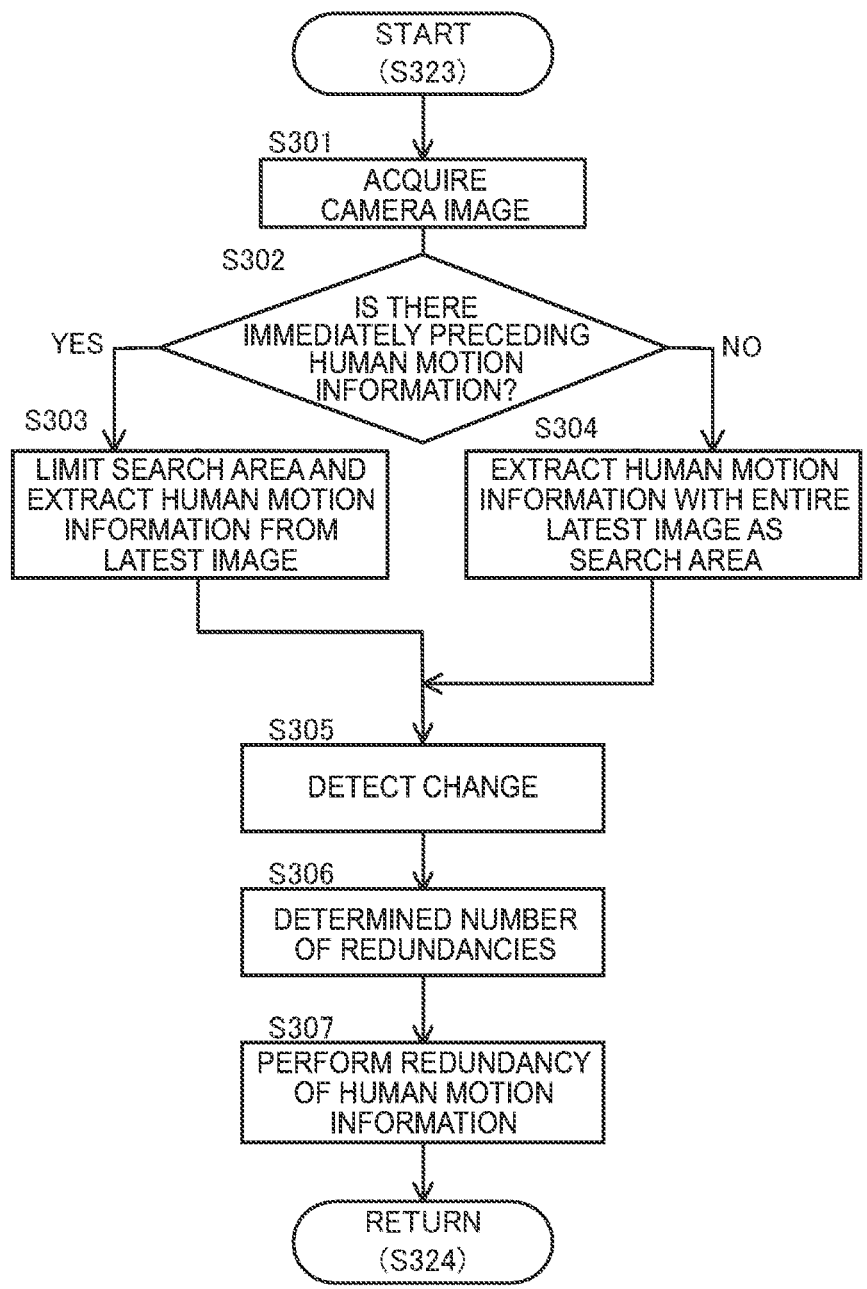
FIG. 11 is a flowchart representing the operation of the human motion information encoding unit.

FIG. 11 is a flowchart representing the processing of the human motion information encoding unit 202. The executing subject of the flowchart explained below is the CPU 131 of the mobile object processing device 125.

In step S301, the mobile object processing device 125 acquires the latest image frame from the recorded video of the first camera 121 and the recorded video of the second camera 122 in the first image input unit 121A and the second image input unit 122A, respectively, and then proceeds to step S302. In the ensuing explanation, the latest image frame acquired by the first image input unit 121A and the second image input unit 122A is hereinafter referred to as the "latest image". Moreover, the image frame immediately preceding the latest image is hereinafter referred to as the "immediately preceding image".

In step S302, the mobile object processing device 125 determines whether the human motion information based on the immediately preceding image is stored in the main storage unit 132. When it is determined that the human motion information based on the immediately preceding image is stored, the mobile object processing device 125 proceeds to step S303. Meanwhile, when it is determined that the human motion information based on the immediately preceding image is not stored, the mobile object processing device 125 proceeds to step S304.

In step S303, the mobile object processing device 125 extracts the human motion information from the latest image based on the stored human motion information. In other words, the area of searching for the facial parts and joints is narrowed based on the stored human motion information. Subsequently, the mobile object processing device 125 associates the obtained human motion information with the immediately preceding human motion information and stores the associated information in the main storage unit 132, and then proceeds to step S305.

In step S304, the mobile object processing device 125 detects the human motion information with the entire latest image as the search area, associates the detected human motion information with the obtained human motion information and stores the associated information in the main storage unit 132, and then proceeds to step S305.

In step S305, the mobile object processing device 125 detects changes in the position or orientation of the face or joints from a plurality of pieces of human motion information. This detection of changes may be based on only two pieces of human motion information; specifically, the human motion information obtained from the latest image and the immediately preceding human motion information, or other previously obtained human motion information may also be used in combination.

In subsequent step S306, the mobile object processing device 125 determines the number of redundancies from the change information detected in step S305 and the redundancy condition table 500. Subsequently, in subsequent step S307, the mobile object processing device 125 makes redundant the latest human motion information based on the number of redundancies determined in step S306, encodes the redundant latest human motion information, and outputs the encoded latest human motion information to the abstraction unit 205. The program represented with the operation based on the flowchart shown in FIG. 11 is thereby ended, and the mobile object processing device 125 then returns to S324 of FIG. 10.

(Flowchart of Server Processing Device)

Figure 12:
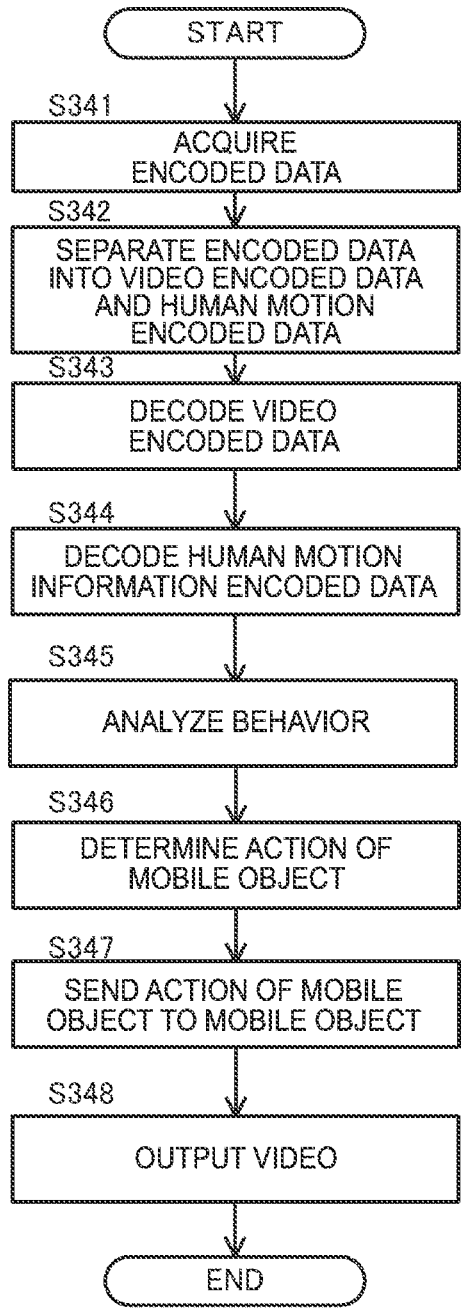
FIG. 12 is a flowchart representing the operation of the server processing device.

FIG. 12 is a flowchart representing the operation of the program executed by the server processing device 105. The executing subject of the flowchart explained below is the CPU 141 of the server processing device 105.

In step S341, the server processing device 105 acquires the encoded data from the server communication device 106. In subsequent step S342, the encoded data processing unit 252 of the server processing device 105 separates the acquired encoded data into video encoded data and human motion encoded data. In subsequent step S343, the video decoding unit 253 of the server processing device 105 decodes the separated video encoded data and acquires the video.

In subsequent step S344, the human motion information decoding unit 254 of the server processing device 105 decodes the human motion encoded data. Here, if the damage or loss of the human motion information is detected, the human motion information is restored by using the redundant data. In subsequent step S345, the behavior analyzing unit 255 of the server processing device 105 analyzes the human motion information obtained in step S344. In subsequent step S346, the mobile object action determination unit 256 of the server processing device 105 determines the action of the mobile object 2 based on the analysis result in step S345. In subsequent step S347, the mobile object action determination unit 256 of the server processing device 105 sends the action of the mobile object 2 determined in step S346 to the mobile object 2 via the server communication device 106. In subsequent step S348, the video decoding unit 253 of the server processing device 105 outputs the video data decoded in step S343 to the output device group 107 and displays the output video data on the output device group 107, and the program represented with the operation based on the flowchart shown in FIG. 12 is thereby ended.

The following effects can be obtained according to the first embodiment described above.

(1) An arithmetic unit such as a human information extraction device 3 comprises a video input unit, or a first image input unit 121A, to which is input recorded video information obtained by taking a video of a human, a memory, or a main storage unit 132 or an auxiliary storage unit 133, which stores human motion information as information related to movement of the human, and a transmission unit, or a redundancy unit 214, an abstraction unit 205, and a packet generation unit 206, which sends the integrated information to an external device so that availability of the human motion information in the external device will increase more for the human motion information determined as having high importance.

When the important of information related to the movement of the user as the subject is high, the human information extraction device 3 sends the human motion information to be sent by being integrated with the recorded video of the human so that the availability of such human motion information in the server 4 will increase. Consequently, the human information extraction device 3 increase the possibility that the server 4 can acquire important human motion information together with the recorded video.

(2) The abstraction unit 205 synchronizes and integrates the human motion information with the recorded video information. Thus, it is not necessary to affix a time stamp for associating the recorded video information and the human motion information. Furthermore, the server 4 that received the foregoing recorded video information and human motion information can easily process such information because they have been synchronized in advance.

(3) The redundancy unit 214 makes redundant the human motion information. Thus, even if the human motion information is partially lost during the communication, so as long as redundant data, such as first redundant data or second redundant data, reaches the server 4, the server 4 is able to obtain the human motion information.

(4) The abstraction unit 205 synchronizes and integrates the human motion information and the redundant human motion information, such as the first redundant data or the second redundant data, as shown in FIG. 8B. Thus, it is not necessary to affix a time stamp on both the human motion information and the redundant human motion information. Moreover, the server 4 will be able to easily determine with which human motion information the redundant human motion information corresponds.

(5) The redundancy unit 214 the importance to be higher as the movement of the user is greater. Thus, when changes in the user's movement in which the necessity of the human motion information is considered to be high, it is possible to increase the possibility that the server 4 can acquire the human motion information.

Modified Example 1

The human motion information encoding unit 202 may change the priority of the packets containing the human motion information in substitute for making redundant the human motion information. For example, the priority of the packets containing the human motion information may be set to be higher as the change amount of such human motion information is greater. In other words, the availability of the human motion information in the server 4 may be increased by increasing the priority of the packets.

FIG. 13 is a diagram showing an example of the redundancy condition table 500A in Modified Example 1. The redundancy condition table 500A includes the field of a priority 503A in substitute for the field of the number of redundancies 503 in first embodiment. In other words, in Modified Example 1, the priority 503A which indicates the importance of the human motion information is determined based on the change amount condition 501 and the frequency band condition 502. Values of the field of the priority 503A will be described later.

Figure 14:
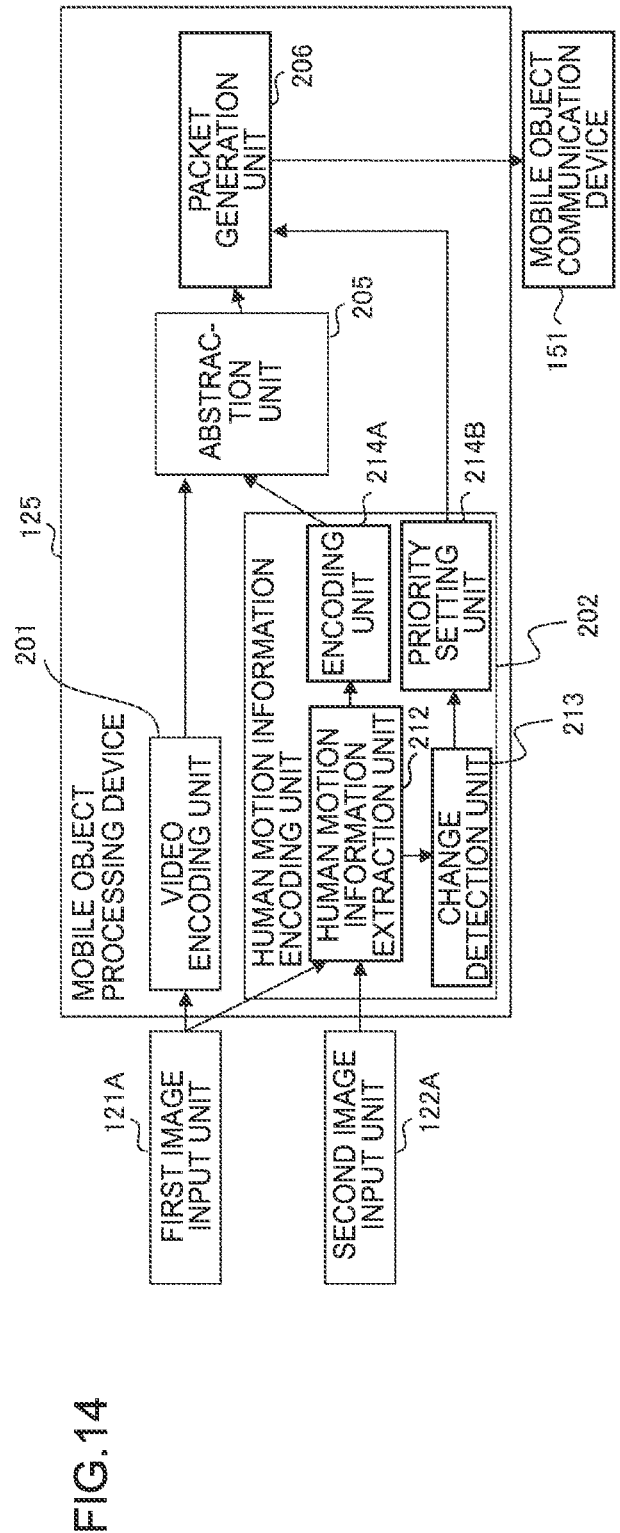
FIG. 14 is a block diagram showing a functional configuration of the mobile object processing device in Modified Example 1.

FIG. 14 is a block diagram showing a functional configuration of the mobile object processing device 125 in Modified Example 1. An encoding unit 214A and a priority setting unit 214B are provided in substitute for the redundancy unit 214 in first embodiment.

The encoding unit 214A performs the abstraction of the human motion information extracted by the human motion information extraction unit 212 and generates human motion encoded data, and outputs the generated human motion encoded data to the abstraction unit 205. The priority setting unit 214B determines the priority based on the detection result of the change detection unit 213 and the redundancy condition table 500A, and outputs the determined priority to the packet generation unit 206.

The packet generation unit 206 processes the packets based on the priority set by the priority setting unit 214B. The processing of the packets is performed based on the rules of priority control and frequency band control in the communication network to which the mobile object communication device 151 and the server communication device 106. As the priority set by the priority setting unit 214B is higher, it becomes easier for the packets to each the server communication device 106. The processing of the packets is targeted to, for instance, one among the UDP port number, IP header TOS (Type Of Service) field, and VLAN tag.

Note that the redundancy condition table 500A may also be configured so that the priority of all packets including the human motion encoded data is set to be high.

According to Modified Example 1, the following effects can be obtained in addition to the effects of the first embodiment.

(1) The priority setting unit 214B and the packet generation unit 206 increase the priority of the packets including the human motion information to be sent to the server 4. Thus, the packets including the human motion information are less likely to become abandoned in the communication path to the server 4, and the possibility that the server 4 can obtain the human motion information is thereby increased.

(2) The priority setting unit 214B and the packet generation unit 206 increase the priority of the packets including the human motion encoded data corresponding to the human motion information as the priority of such human motion information is higher. Thus, as the importance of the human motion information is higher, it is possible to increase the possibility that the server 4 can obtain the human motion information.

Modified Example 2

The human motion information encoding unit 202 may add an Error Correction Code (ECC) of the human motion information in substitute for making redundant the human motion information. For example, the number of error correctable bits of the human motion information may be increased as the change amount of such human motion information is greater. In other words, the availability of the human motion information in the server 4 may be increased by adding the ECC.

Figure 15:
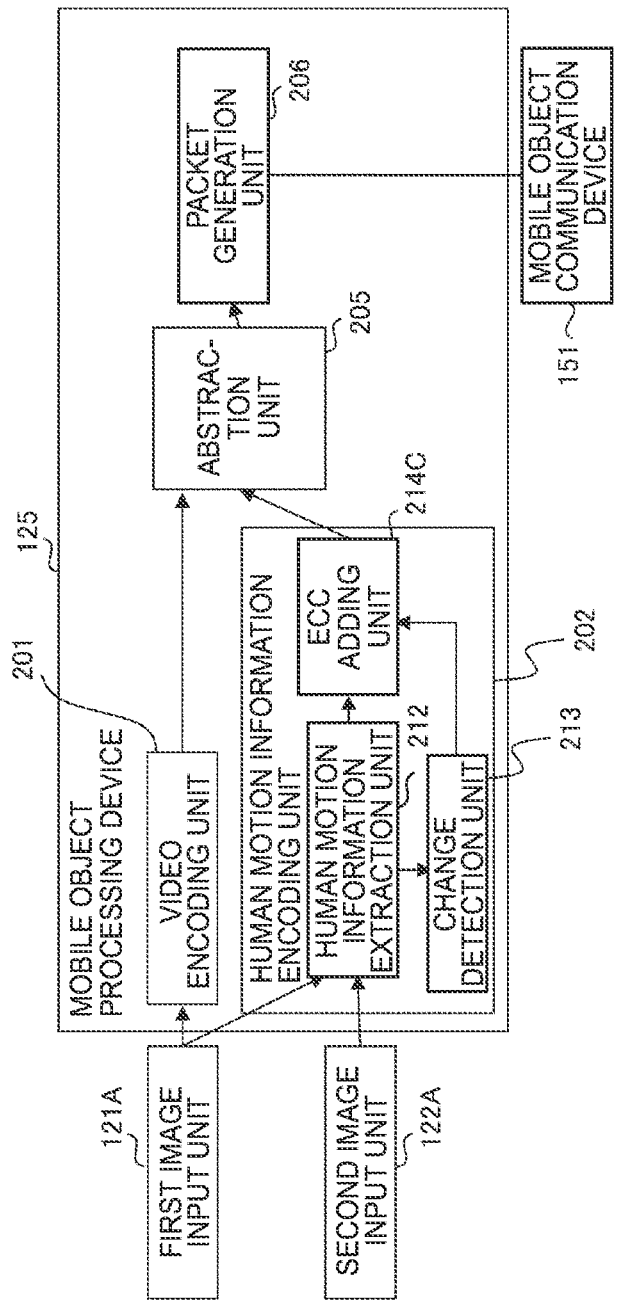
FIG. 15 is a block diagram showing a functional configuration of the mobile object processing device in Modified Example 2.

FIG. 15 is a block diagram showing a functional configuration of the mobile object processing device 125 in Modified Example 2. An ECC adding unit 214C is provided in substitute for the redundancy unit 214 in the first embodiment. The ECC adding unit 214C encodes the human motion information and creates an ECC of the human motion information. However, an ECC is not created for all human motion information, and is created only for human motion information in which the important evaluated in the same manner as the first embodiment is determined to be a predetermined value or higher. In the ensuing explanation, the ECC of human motion information in which the importance is a predetermined value or higher is hereinafter referred to as a "human motion correction code". For example, when the predetermined value is "1", the generation of the human motion correction code may be replaced with the value of the field of the number of redundancies 503 in the redundancy condition table 500. In other words, an ECC is not generated when the number of redundancies is zero, and a human motion correction code is generated when the number of redundancies is 1 or more. Furthermore, the human motion correction code is generated so that higher error correcting capability is realized; that is, so that there will be more error correctable bits, as the number of redundancies is higher. In other words, the redundant data in the first embodiment corresponds to the human motion correction code in Modified Example 2. The ECC adding unit 214C outputs the human motion encoded data and the human motion correction code to the abstraction unit 205.

The abstraction unit 205 handles the human motion correction code in the same manner as the redundant data in the first embodiment. In other words, as with FIG. 8B in the first embodiment, the video encoded data and the human motion encoded data created based on the data recorded at a certain timing, and the human motion correction code, are synchronized and integrated. Note that the ECC adding unit 214C may also generate the ECC of the human motion encoded data as the human motion correction code.

According to Modified Example 2, the following effects can be obtained in addition to the effects of the first embodiment.

(1) The ECC adding unit 214C generates an ECC of human motion information, and the packet generation unit 206 sends the human motion information and the ECC to the server 4. Thus, even if a part of the human motion information is damaged during the communication, the server 4 can restore the human motion information by using the ECC.

(2) The abstraction unit 205 and the packet generation unit 206 additionally integrate a human motion correction code to the human motion information determined as having high importance in the integrated information, and sends the integrated information to a third device. Thus, there is no need to affix a time stamp on both the human motion information and the human motion correction code. Moreover, the server 4 can easily determine with which human motion information the human motion correction code corresponds.

Modified Example 3

The number of redundancies of the human motion encoded data may also be determined other than based on the change amount of the human motion information. For example, the number of redundancies of the human motion encoded data may also be determined based on the condition that the status of the human represented by the human motion information coincides with a predetermined status. For example, the number of redundancies of the human motion encoded data may also be determined based on the condition that the status of the human represented by the human motion information coincides with the status of the human pointing at something, or the status of the human imitating the movement of an animal. In other words, the human motion information in which the human is holding a specific pose may be determined to be important.

FIG. 16 is a diagram showing an example of the redundancy condition table 500B in Modified Example 3. The redundancy condition table 500B includes a field of the status condition 501A in substitute for the field of the change amount condition 501 in the first embodiment. The field of the status condition 501A stores face information and joint information indicating the user's specific status.

According to Modified Example 3, the following effects can be obtained in addition to the effects of the first embodiment.

(1) The redundancy unit 214 determines that the importance is high when the movement of the human coincides with a predetermined status. Thus, it is possible to increase the availability of information, in which the user is holding a specific pose, in the server 4.

Modified Example 4

The server processing device 105 may also determine whether the human motion encoded data is included in the data received from the mobile object processing device 125. In the foregoing case, the server processing device 105 executes the following processing prior to executing step S344 of FIG. 12. Specifically, the server processing device 105 determines whether SEI exists in the NAL unit as the data received from the mobile object processing device 125. Subsequently, when it is determined that the human motion encoded data is not included in the data received from the mobile object processing device 125, the server processing device 105 analyzes the behavior by using the immediately preceding human motion information stored in the main storage unit 142.

Modified Example 5

The human motion information extraction unit 212 does not need to be included in the mobile object processing device 125. In the foregoing case, the recorded video of the first camera 121 and the recorded video of the second camera 122 are input to a human motion information extraction unit 212 existing outside the mobile object processing device 125, and the human motion information as the processing result of the human motion information extraction unit 212 is written into the memory; that is, the main storage unit 132 or the auxiliary storage unit 133, of the mobile object processing device 125. The change detection unit 213 performs operations based on the human motion information written into the main storage unit 132 or the auxiliary storage unit 133.

Modified Example 6

The second camera 122 may have the same hardware structure as the first camera 121, and the distance to the subject may be calculated by using the images obtained from the two cameras and the physical positional relation of the two cameras. Furthermore, the calculation of the foregoing distance may also be executed within the second camera 122, or executed within the human information extraction device 3. Moreover, the mobile object 2 may also comprises a sensor for measuring the distance, such as a laser radar, in substitute for the second camera 122.

The foregoing embodiments may be additionally modified as follows.

(1) The redundancy condition table 500 does not need to comprise the field of the frequency band condition 502. In other words, the number of redundancies 503 may be determined based on only the change amount condition 501.

(2) While the human motion information was configured from face information and joint information, the human motion information may also be configured from only one of either face information or joint information.

(3) When the human motion encoded data is not included in the received packets, the human motion information decoding unit 254 of the server 4 may use previously acquired human motion encoded data.

Second Embodiment

The second embodiment of the Arithmetic system is now explained with reference to FIG. 17. In the ensuing explanation, the constituent elements that are the same as the first embodiment are given the same reference numeral, and only the differences are mainly explained. Points that are not specifically explained are the same as the first embodiment. This embodiment differs from the first embodiment mainly with respect to the point that the redundancy condition table is received from the server.

Figure 17:
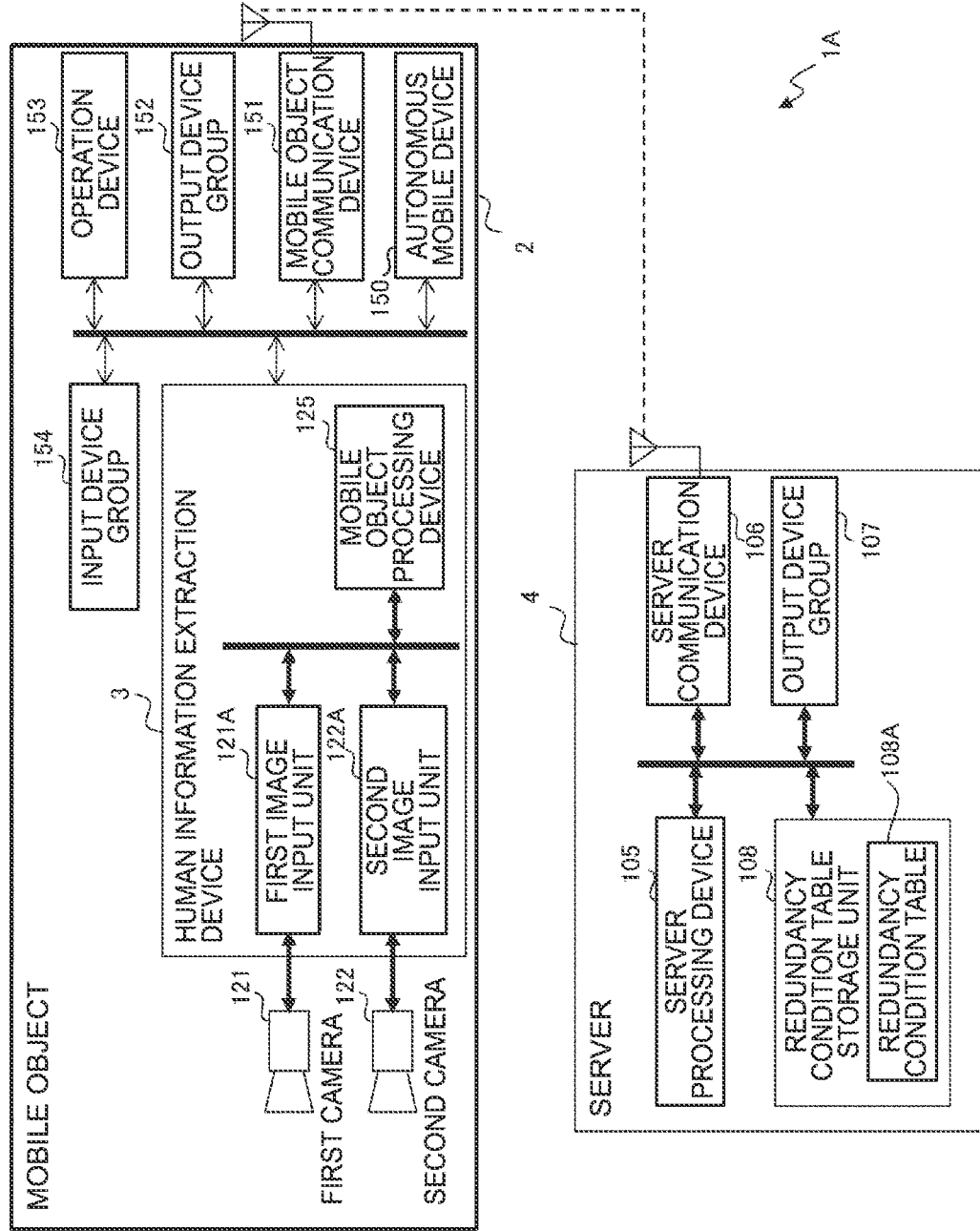
FIG. 17 is a block diagram showing a configuration of the Arithmetic system in the second embodiment.

FIG. 17 is a block diagram showing a configuration of the Arithmetic system 1A in the second embodiment. The configuration of the mobile object 2 is the same as the first embodiment. However, the redundancy condition table 500 does not have to be pre-stored in the auxiliary storage unit 133 of the mobile object processing device 125. The server 4 additionally comprises a redundancy condition table storage unit 108 in addition to the configuration of the first embodiment. The redundancy condition table storage unit 108 stores a redundancy condition table 108A.

The CPU 141 of the server processing device 105 sends the redundancy condition table 108A to the mobile object 2. The mobile object processing device 125 that received the mobile object processing device 125 from the server 4 stores the received redundancy condition table 108A as the redundancy condition table 500 in the main storage unit 132 or the auxiliary storage unit 133. The redundancy unit 214 of the mobile object processing device 125 determines the number of redundancies by using the redundancy condition table 500 received from the server 4.

The following effects can be obtained according to the second embodiment described above.

(1) The redundancy unit 214 determines the importance based on the conditions received from the server 4. Thus, the human information extraction device 3 can operate based on the standards prescribed by the server 4 to receive the human motion information.

Modified Examples of Second Embodiment

The server 4 may further comprise a redundancy condition table generation unit which generates the redundancy condition table 108A. The redundancy condition table generation unit generates the redundancy condition table 108A based on whether or not the human motion information decoding unit 254 was able to decode the human motion information and based on the number of received redundant data.

For instance, if the human motion information decoding unit 254 is unable to decode the human motion encoded data because the received human motion encoded data is damaged and redundant data is not available, the redundancy condition table generation unit generates the redundancy condition table 108A so that the threshold of the change amount condition 501 is lowered. Moreover, if the redundant data has been added but cannot be sufficiently restored, the redundancy condition table generation unit generates the redundancy condition table 108A so as to increase the number of redundancies 503. Furthermore, if the human motion encoded data is not damaged and multiple redundant data have been added, the redundancy condition table generation unit generates the redundancy condition table 108A so as to decrease the number of redundancies 503.

The present invention additionally includes the following arithmetic unit. In other words, An arithmetic unit such as a human information extraction device 3 is connected with a first device such as a first camera 121 comprising image sensors, a second device such as a second camera 122 comprising sensors capable of calculating distance information by using the measurement result, and a third device such as a server 4. The human information extraction device 3 comprises a video input unit, or a first image input unit 121A, to which is input recorded video information obtained by taking a video of a human, or a user, from the first device; a memory, or a main storage unit 132 or an auxiliary storage unit 133, which stores human motion information as information related to movement of the user which is created based on the measurement result obtained from the sensors measuring the user; an importance determination unit, or a redundancy unit 214, which determines importance of the human motion information; an integration unit, or an abstraction unit 205, which creates integrated information by integrating the recorded video information and the human motion information; and a processing/transmission unit, or a redundancy unit 214, an abstraction unit 205, and a packet generation unit 206, which sends the integrated information to the server so that availability of the human motion information in the server 4 will increase more for the human motion information determined as having high importance by the redundancy unit 214.

The human information extraction device 3 may comprise an I/O interface (not shown), and the program may be read from another device as needed via the I/O interface and a medium that can be used by the human information extraction device 3. Here, the term "medium" refers to, for instance, a storage medium or a communication medium that can be attached to and detached from the I/O interface; specifically, a wired, wireless, or optical network, or carrier waves and digital signals that are propagated through such network. Moreover, a part or all of the functions realized by the program may be realized using a hardware circuit or an FPGA.

The respective embodiments and modified examples described above may also be combined with each other.

While various embodiments and modified examples were explained above, the present invention is not limited thereto. Other modes that can be considered with the range of the technical concept of the present invention are also covered by the present invention.

What is claimed is:

1. A mobile object, comprising:
an interface which communicates via a wireless link with an external device;
a memory which stores a redundancy condition in which a plurality of change amount conditions and a plurality of redundancy amounts are held in correspondence; and
a processor,
wherein the memory further stores instructions that, when executed by the processor, cause the processor to:
encode video information obtained by taking a video of a human;
extract, from the video information, human motion information;
detect a change in a position of the human based on the human motion information;
determine a redundancy amount based on the detected change in the position of the human and the redundancy condition;
generate a data unit which includes the encoded video information, the extracted human motion information and one or more pieces of redundant human motion information in which the extracted human motion information is made redundant, a number of the one or more pieces of redundant human motion information being specified by the determined redundancy amount;
divide the data unit into a plurality of packets, the extracted human motion information and each piece of the redundant human motion information being separated in different ones of the packets; and
transmit the plurality of packets from the interface to the external device,
wherein the human motion information is extracted from a latest image,
wherein the human motion information includes face information related to a face of the human in the video, the face information including at least one of an area of the face, a facial part position, and a facial part status, and
wherein each piece of the redundant human motion information is redundant with respect to the extracted human motion information in the data unit.

2. The mobile object according to claim 1, wherein the facial part status includes at least one of a status of eyes and a status of a mouth.

3. The mobile object according to claim 1, wherein the human motion information includes joint information related to a joint of the human in the video, the joint information including at least one of an position of the joint and an orientation of the joint.

4. The mobile object according to claim 1, wherein the memory stores the redundancy condition in which a plurality of frequency band conditions of the wireless link, the plurality of change amount conditions and the plurality of redundancy amounts are held in correspondence, and
wherein the memory further stores instructions that, when executed by the processor, cause the processor to:
determine, from among the plurality of redundancy amounts, the redundancy amount which corresponds to one of the plurality of change amount conditions satisfied by the detected change and which corresponds to one of the plurality of frequency band conditions satisfied by a state of the wireless link.

5. The mobile object according to claim 1, wherein the video information is encoded from the latest image of the video of the human, and
wherein the data unit includes the encoded video information from the latest image, the extracted human motion information from the latest image and the redundant human motion information in which the extracted human motion information from the latest image is made redundant according to the determined redundancy amount.

6. The mobile object according to claim 1, wherein the memory stores the redundancy condition in which higher redundancy amounts are held in correspondence with higher change amount conditions.

7. The mobile object according to claim 1, wherein the plurality of change amount conditions include at least one of an overall average change amount, an arm change amount, a leg change amount and a maximum change amount.

8. The mobile object according to claim 1, wherein the memory further stores instructions that, when executed by the processor, cause the processor to:
transmit the plurality of packets which are divided from the data unit from the interface to the external device with a higher priority than other packets transmitted over the wireless link.

9. The mobile object according to claim 1, wherein the memory further stores instructions that, when executed by the processor, cause the processor to:
transmit the plurality of packets which are divided from the data unit from the interface to the external device with a higher priority than other packets.

10. A method performed by a mobile object which communicates via a wireless link with an external device, comprising:
encoding video information obtained by taking a video of a human;
extracting, from the video information, human motion information;
detecting a change in a position of the human based on the human motion information;

determining a redundancy amount based on the detected change in the position of the human and a redundancy condition in which a plurality of change amount conditions and a plurality of redundancy amounts are held in correspondence;

generating a data unit which includes the encoded video information, the extracted human motion information and one or more pieces of redundant human motion information in which the extracted human motion information is made redundant, a number of the one or more pieces of redundant human motion information being specified by the determined redundancy amount;

dividing the data unit into a plurality of packets, the extracted human motion information and each piece of the redundant human motion information being separated in different ones of the packets; and transmitting the plurality of packets over the wireless link to the external device, wherein the human motion information is extracted from a latest image, wherein the human motion information includes face information related to a face of the human in the video, the face information including at least one of an area of the face, a facial part position, and a facial part status, and wherein each piece of the redundant human motion information is redundant with respect to the extracted human motion information in the data unit.

11. The method according to claim 10, wherein the facial part status includes at least one of a status of eyes and a status of a mouth.

12. The method according to claim 10, wherein the human motion information includes joint information related to a joint of the human in the video, the joint information including at least one of an position of the joint and an orientation of the joint.

13. The method according to claim 10, wherein the redundancy condition holds a plurality of frequency band conditions of the wireless link, the plurality of change amount conditions and the plurality of redundancy amounts in correspondence, and wherein the redundancy amount is determined, from among the plurality of redundancy amounts, to correspond to one of the plurality of change amount conditions satisfied by the detected change and to correspond to one of the plurality of frequency band conditions satisfied by a state of the wireless link.

14. The method according to claim 10, wherein the video information is encoded from the latest image of the video of the human, and wherein the data unit includes the encoded video information from the latest image, the extracted human motion information from the latest image and the redundant human motion information in which the extracted human motion information from the latest image is made redundant according to the determined redundancy amount.

15. The method according to claim 10, wherein the plurality of change amount conditions include at least one of an overall average change amount, an arm change amount, a leg change amount and a maximum change amount.

16. The method according to claim 10, wherein the plurality of packets which are divided from the data unit are transmitted over the wireless interface to the external device with a higher priority than other packets.

17. The method according to claim 10, wherein the plurality of packets which are divided from the data unit are transmitted over the wireless link to the external device with a higher priority than other packets transmitted over the wireless link.

18. A system comprising:

an external device; and a mobile object which communicates via a wireless link with the external device, wherein the mobile object includes a first memory which stores a redundancy condition in which a plurality of change amount conditions and a plurality of redundancy amounts are held in correspondence, and a first processor, wherein the first memory further stores instructions that, when executed by the first processor, cause the first processor to:

encode video information obtained by taking a video of a human;

extract, from the video information, human motion information;

detect a change in a position of the human based on the human motion information;

determine a redundancy amount based on the detected change in the position of the human and the redundancy condition;

generate a data unit which includes the encoded video information, the extracted human motion information and one or more pieces of redundant human motion information in which the extracted human motion information is made redundant, a number of the one or more pieces of redundant human motion information being specified by the determined redundancy amount;

divide the data unit into a plurality of packets, the extracted human motion information and each piece of the redundant human motion information being separated in different ones of the packets; and transmit the plurality of packets over the wireless link to the external device, wherein the external device includes a second memory and a second processor, and the second memory stores instructions that, when executed by the second processor, cause the second processor to:

receive at least a portion of the plurality of packets from the mobile object;

analyze the extracted human motion information included in the received portion of the plurality of packets and determine an action of the mobile object based thereon; and transmit the determined action to the mobile object, wherein the human motion information is extracted from a latest image, wherein the human motion information includes face information related to a face of the human in the video, the face information including at least one of an area of the face, a facial part position, and a facial part status, and wherein each piece of the redundant human motion information is redundant with respect to the extracted human motion information in the data unit.

* * * * *